United States Patent [19]  
Kakiuchi et al.

[11] Patent Number: 4,931,724  
[45] Date of Patent: Jun. 5, 1990

[54] DIGITAL LEVEL INDICATING DEVICE

[75] Inventors: Shizuo Kakiuchi; Hiroshi Iizuka, both of Saitama, Japan

[73] Assignee: Pioneer Electronic Corporation, Tokyo, Japan

[21] Appl. No.: 382,875

[22] Filed: Jul. 21, 1989

Related U.S. Application Data

[62] Division of Ser. No. 87,080, Aug. 19, 1987, Pat. No. 4,870,349.

[30] Foreign Application Priority Data

Aug. 19, 1986 [JP] Japan .................. 61-195054  
Aug. 19, 1986 [JP] Japan .................. 61-195055  
Aug. 19, 1986 [JP] Japan .................. 61-195056  
Aug. 19, 1986 [JP] Japan .................. 61-195058

[51] Int. Cl.$^5$ .................. G01R 19/16; G01R 15/08  
[52] U.S. Cl. .................. 324/103 P; 324/96; 324/115; 324/132  
[58] Field of Search .................. 324/103 P, 102, 115, 324/132, 122, 96; 307/351; 381/56

[56] References Cited

U.S. PATENT DOCUMENTS 4,166,245 8/1979 Roberts .................. 324/103 P  
4,388,590 6/1983 Richards et al. .................. 307/351

Primary Examiner—Ernest F. Karlsen  
Attorney, Agent, or Firm—Sughrue, Mion, Zinn, Macpeak & Seas

[57] ABSTRACT

A digital level indicating device for use in compact disk players digital audio tape recorders, etc., which includes a converter circuit for converting a digital signal applied thereto to an absolute value signal representative of an absolute value of the digital signal. A peak holding circuit detects and holds a peak of the absolute value signal. A first decoder log-converts the absolute value signal. A second decoder log-converts a signal held by the peak holding circuit. Indicator means display a level of the digital signal in accordance with outputs from both the first and second decoder. A selector switches the choices of resolution of the first decoder and the second decoder.

1 Claim, 3 Drawing Sheets

DIGITAL LEVEL INDICATING DEVICE

This is a division of application Ser. No. 07/087,080 filed Aug. 19, 1987, now U.S. Pat. No. 4,870,349.

BACKGROUND OF THE INVENTION

1. Field of the Invention

The present invention relates to a digital level indicating device suitable for use in compact disk (CD) players, digital audio tape recorders (DATs), etc.

In PCM record/playback equipment such as CD players and DATs, an analog audio signal is recorded on a recording medium in digital form and, during playback, a digital signal is converted to an analog signal and then output. FIG. 1 is a block diagram of a digital level indicating device which is used for monitoring a level of the digital signal in such equipment.

In FIG. 1, a converter circuit 1 converts a digital signal applied thereto to a digital absolute value signal representative of an absolute value of the digital input signal and then outputs the resultant absolute value signal. This absolute value signal is applied to a decoder 2 comprising a ROM, logic gates, etc. in which the input is subjected to logarithmic conversion for decibel (dB) indication and is also converted to an indicator signal suitable for visual display. An output from the decoder 2 is applied to a peak holder circuit 4 to detect and hold a peak value thereof. A synthesizer circuit 5 synthesizes, into a synthesized a signal delivered from the decoder 2 corresponding to an instantaneous level (absolute value) and another signal delivered from the peak holder circuit 4 corresponding to a peak level (absolute value). The synthesized indicator signal is supplied to a driver 7 which in turn drives a display 8, comprising a plurality of lamps, LEDs etc., in accordance with the indicator signal. Alternately, two drivers 7 and two displays 8 can be used and the synthesizer can be eliminated. As a result, both the instantaneous level and the peak level are indicated by the display 8.

By operating a selector 3 to switch the choices of resolution of the decoder 2 from one to another, the digital level can be indicated on the display 8 with an increment of 3 dB or 1 dB, for example.

As described above, since such a prior device is designed to peak-hold the output for the decoder 2, there arise drawbacks as follows. When the selector 3 is operated to select 1 dB resolution during an indication mode of 3 dB resolution, for example, the peak holder circuit 4 still holds the previous peak value which has been decoded with the preceding 3 dB resolution. Therefore, the peak value based on the selected new 1 dB resolution will not be indicated unless a value that is greater by about 3 dB than the previously held value is applied to the peak hold circuit 4. To avoid this, it has been required to provide a reset switch 6 associated with the peak holder circuit 4 and to turn on the reset switch 6 each time the selector 3 is so switched in order to once reset the holding status of the peak holder circuit 4.

FIG. 2 is a block diagram showing another prior example of the digital level indicating device.

An absolute value signal comprising n bits representative of an absolute value of the digital signal is applied to terminals 1, 2, 3 . . . n in one-bit to one-terminal relation, e.g., with the most and least significant bits (MSB and LSB) applied to the terminal 1 and to the terminal respectively. If the most significant bit which has a logic 1 (high) level is given by a signal applied to the terminal 2, for example, an associated OR circuit 24 delivers an output of logic 1. As a result, an inverter 35 delivers an output of logic 0 (low level) so that an electrical current passes through a resistor 55 from a predetermined voltage source (not shown) at +V to illuminate a light emitting diode 45.

An output of the OR circuit 24 is delivered to a following or lower OR circuit 25, an output of this OR circuit 25 is delivered to yet a lower OR circuit 26, and so on. With such operation repeated, all the light emitting diodes 46, 47 . . . lower than the light emitting diode 45 are illuminated.

The n-th bit data from the MSB is adapted to drive the light emitting diode indicative of −6 ndB. This permits a level of the digital signal to be indicated with an increment of 6 dB.

Decoders 11, 12, 13 . . . are provided to change the increment of level indication from 6 dB to 3 dB. With the data at the terminal 1 having the logic 0 level and the data at the terminal 2 having the logic 1 level, for example, when the data of logic 1 is applied to any one of the other terminals and has a value greater than 3 dB, the decoder 13 delivers an output of logic 1. Accordingly, an OR circuit 23 delivers an output of logic 1 and an inverter 34 delivers an output of logic 0 to thereby illuminate all the light emitting diodes lower than the light emitting diode 44.

In this way, the digital level can be indicated with an increment of 3 dB while the full scale is indicating the level of 0 dB.

As described above, the part of the decoder 2 for subjecting an absolute value signal to logarithmic conversion for decibel indication comprises the decoders 11, 12 . . . . The part of the decoder 2 for converting the log-converted signal to an indicator signal suitable for visual indication comprises the OR circuits 21, 22 . . . . The driver 7 comprises the inverters 31, 32 . . . , and the display 8 comprises the light emitting diodes 41, 42 . . . and the resistors 51, 52 . . . . With such a structure, the prior device has the accompanying disadvantage of being fixed in both the indication step and the resolution. Another disadvantage has been that it is capable of carrying out bar or dot indication with the light emitting diodes 41, 42 . . . but it is not adaptable to the case of indicating the decibel values in characters.

DETAILED DESCRIPTION OF THE PREFERRED EMBODIMENTS

Figure 1:
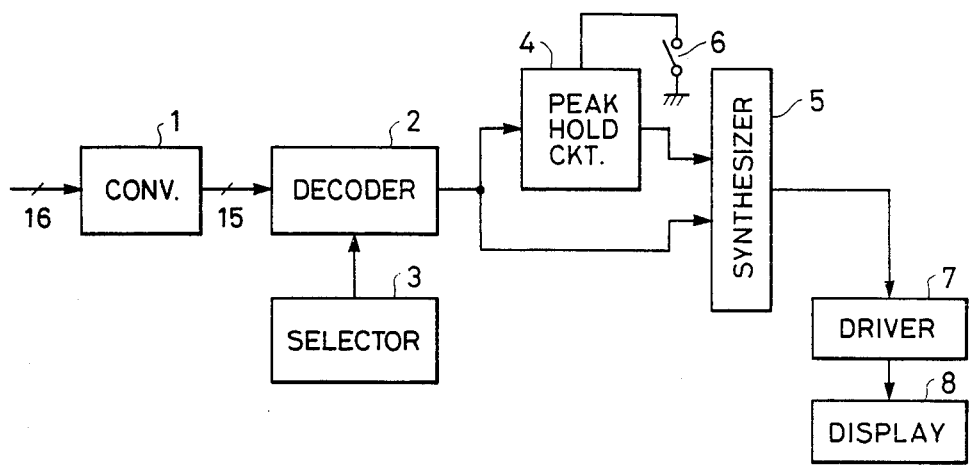
FIG. 1 is a block diagram of a prior art digital level indicating device.
Figure 3:
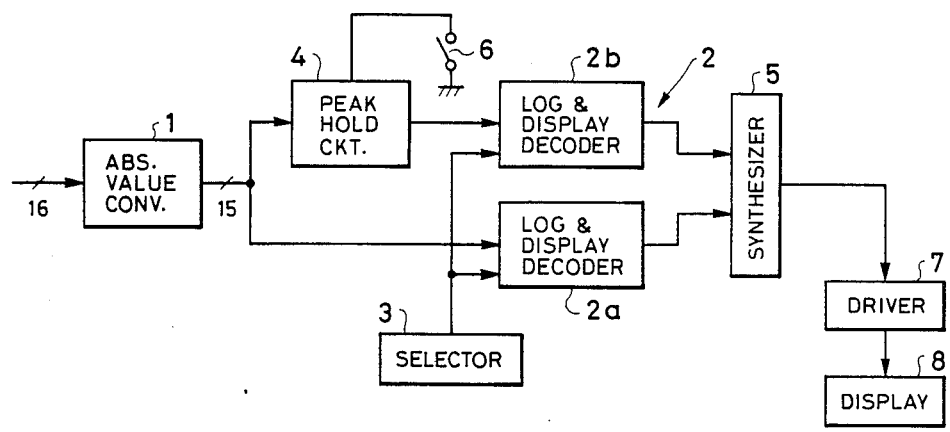
FIG. 3 is a block diagram of a digital level indicating device according to a first embodiment of the present invention.

FIG. 3 is a block diagram of a digital level indicating device according to a first embodiment of the present invention, in which the parts corresponding to those in FIG. 1 are designated by the same reference numerals. In this embodiment, an absolute value signal and a signal holding a peak of the absolute value signal are subjected to logarithmic conversion by separate decoders. More specifically, the absolute value signal delivered from a converter circuit 1 is applied to both a first decoder 2a and to a peak holder circuit 4. An output from the peak holder signal 4 is applied to a second decoder 2b. Respective outputs from the first and second decoders 2a and 2b are both applied to a synthesizer circuit 5. The remaining configuration is identical to that in FIG. 1.

A digital signal applied to the converter circuit 1 is converted to the absolute value signal. For example, when the digital signal is represented by 2's complement with a predetermined number of bits, the MSB is given to be a sign (i.e., 0 for the positive value and 1 for the negative value). Accordingly, in case of data comprising 16 bits by way of example, if the MSB is equal to 0 (i.e., the data is positive), the signal represented by the remaining 15 bits is directly issued as an absolute value signal. On the other hand, if the MSB is equal to 1 (i.e., the data is negative), the absolute value signal of 15 bits is obtained by, for example, carrying out an exclusive-OR operation (NOT operation when the MSB is equal to 1) of respective bits and then adding 1 to the operational result. In this way, the negative data is converted to the same signal (absolute value signal) as for the positive data having the same level.

The absolute value signal is directly applied to the decoder 2a in which an instantaneous level thereof is subjected to logarithmic conversion for decibel indication and further converted to an indicator signal suitable for visual display. The absolute value signal is also applied to the peak holding circuit 4, comprising a comparator and a register by way of example, so as to detect and hold a peak value thereof. The value held by the peak holder circuit 4 is applied to the decoder 2b in which it is subjected to logarithmic conversion and then converted to an indicator signal. Both outputs from the decoders 2a and 2b are synthesized in the synthesizer circuit 5. An output from the synthesizer circuit 5 is supplied to a driver 7 which in turn drives a display 8 in response to the indicator signal issued from the synthesizer circuit 5. As a result, an instantaneous level and a peak level of the digital signal are indicted on the display 8.

Figure 2:
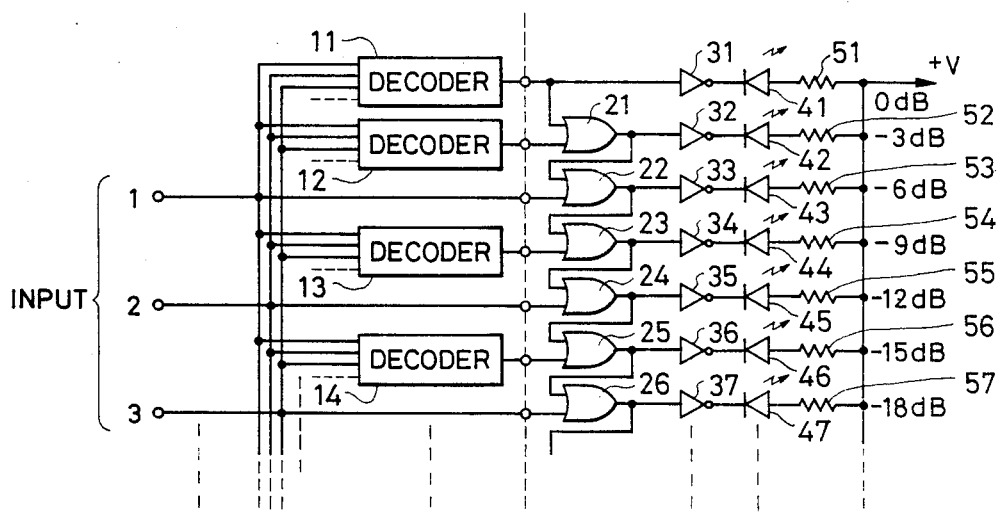
FIG. 2 is a block diagram of another prior art digital level indicating device.

Each of the decoders 2a and 2b, comprising a ROM, logic gates, etc., incorporates a set of decoders having different resolutions (e.g., 1 dB and 3 dB, such as in FIG. 2). The desired decoding pattern is selected by operating the selector 3. Depending on the choice of resolution, the decoder changes its output when the input applied thereto is subjected to a variation larger than 1 dB or 3 dB. Consequently, the digital level is indicated on the display 8 with steps of 1 dB or 3 dB in corresponding to the selected operation.

The peak holder circuit 4 is connected upstream of the decoder 2b and holds a peak value of the absolute value signal irrespective of the selection made on the selector means 3. Accordingly, even when during the display mode, the display stops displaying the value held immediately prior to the switching operation.

It is to be noted that a reset switch 6 associated with the peak holder circuit 4 can be dispensed with.

As described above, the first embodiment according to the present invention permits rapid and accurate display even with the choices of resolution switched from one to another during the indication mode.

Figure 4:
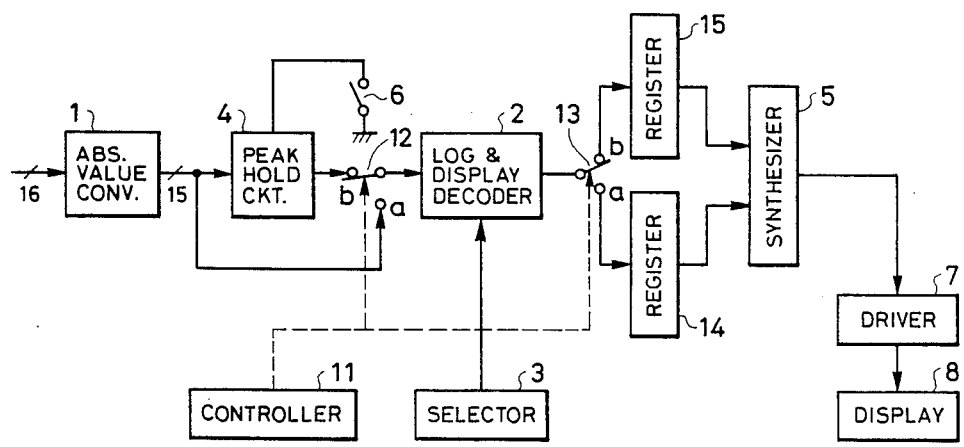
FIG. 4 is a block diagram of a digital level indicating device according to a second embodiment of the present invention.

FIG. 4 is a block diagram of a digital level indicating device according to a second embodiment of the present invention, in which the parts corresponding to those in FIG. 1 are designated by the same reference numerals. In this embodiment, an absolute value signal and a signal holding a peak of the absolute value signal are subjected to logarithmic conversion by a single decoder as in time sharing manner. More specifically, in a the first embodiment shown in FIG. 3, the absolute value signal delivered from a converter circuit 1 is applied to a peak holding circuit 4. An output from the absolute value converter circuit 1 or an output from the peak holder circuit 4 is selectively applied to a single decoder 2 through a first switch 12. An output from the decoder 2 is selectively applied to a register 14 or 15 as storage means through a second switch 13 which is switched by a control circuit 11 in synchronism with the first switch 12. Both outputs from the registers 14 and 15 are thus alternately applied to a synthesizer circuit 5. The remaining configuration is identical to that in FIG. 1.

A digital signal applied to the converter circuit 1 is converted to the absolute value signal in a like manner to that described in connection with FIG. 2.

This absolute value signal is directly supplied to a contact a of the switch 12 and also to the peak holding circuit 4, comprising a comparator and a register by way of example, so as to detect and hold a peak value thereof. An output from the peak holder circuit 4 is supplied to a contact b of the switch 12.

Each piece of data comprising 16 bits is applied to the converter circuit 1 at a predetermined cyclic period T (e.g., 10 $\mu$s). Within the period T, the control circuit 11 synchronously turns over the switches 12 and 13 from the contact a a to b and vice versa. The decoder 2 subjects the input signal to logarithmic conversion and then outputs the log-converted signal for decibel indication. As a result, when the switches 12 and 13 are both turned to the contacts a, an instantaneous level of the digital signal applied to the converter circuit 1 at that time is stored in the register 14. On the other hand, when the switches 12 and 13 are turned to the contacts b, the peak value held by the peak holder circuit 4 is stored in the register 15. Both the outputs from the two registers 14 and 15 are synthesized in the synthesizer circuit 5. An output from the synthesizer circuit 5 is supplied to a driver 7 which in turn drives a display 8 in response to the indicator signal issued from the synthesizer circuit 5. As a result, an instantaneous level and a peak level of the digital signal are indicated on the indicator means 8.

The decoder 2, comprising a ROM, logic gates, etc., incorporates a set of decoders having different resolutions (e.g. 1 dB and 3 dB). The desired decoding pattern is selected by operating the selector 3. Depending on the choice of resolution, the decoder 2 changes its output when the input applied thereto is subjected to a variation larger than 1 dB or 3 dB. Consequently, the digital level is indicated on the display 8 with steps of 1 dB or 3 dB in correspondence to the selected operation.

The peak holding circuit 4 is connected upstream of the decoder 2 and holds a peak value of the absolute value signal irrespective of the selection made on the selector means 3. Accordingly, even with the possible choices of the selector means 3 switched from one to another during the display mode, it will not happen that the value held immediately prior to the switching operation remains and continues to be displayed.

It is to be noted that a reset switch 6 associated with the peak holder circuit 4 can be dispensed with.

Figure 5:
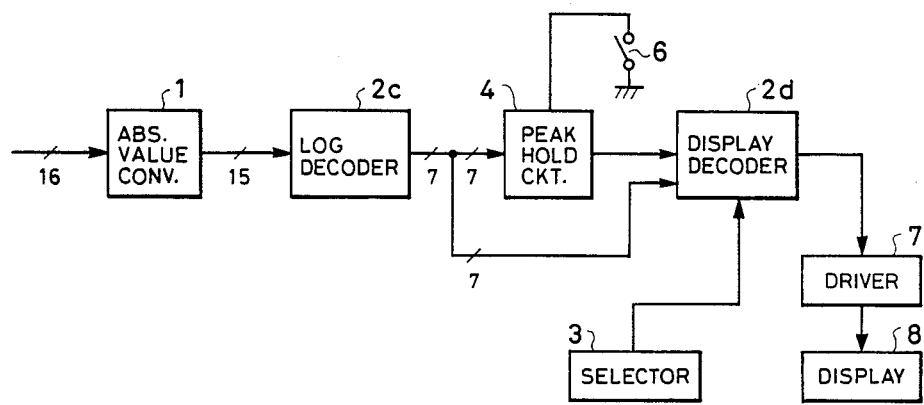
FIG. 5 is a block diagram of a digital level indicating device according to a third embodiment of the present invention.

FIG. 5 is a block diagram of a digital level indicating device according to a third embodiment of the present invention, in which the parts corresponding to those in FIG. 1 are designated by the same reference numerals. In this embodiment, an absolute value signal is subjected to logarithmic conversion by a logarithmic decoder, and an output from the first decoder and a signal holding a peak of the output from the first decoder are converted to an indicator signal by a display decoder. More specifically, the absolute value signal delivered from a converter circuit 1 is applied to a first or logarithmic decoder 2c, an output of which is then applied to a peak holding circuit 4. Both the output from the logarithmic decoder 2c and an output from the peak holding circuit 4 are applied to a second or display decoder 2d which in turn issues an output applied to a driver 7. Switching of resolution from one step to another is made at the display decoder 2d. The remaining configuration is identical to that in FIG. 1.

A digital signal applied to the converter circuit 1 is converted to the absolute value signal in a like manner to that described in connection with FIG. 2.

This absolute value signal is applied to the logarithmic decoder 2c in which its instantaneous level is subjected to logarithmic conversion for decibel indication. Assuming that each piece of data comprise 16 bits, the dynamic range spans approximately 90 dB. Resolution of the logarithmic decoder 2c is set in accordance with the minimum resolution to be indicated. In attempting to indicate a digital level with steps of 1 dB at minimum, for example, an output signal from the logarithmic decoder 2c can be composed of 7 bits because it is needed to represent about 90 different values with that signal. The output from the logarithmic decoder 2c is applied to the peak holding circuit 4, comprising a comparator and a register by way of example, so as to detect and hold a peak value thereof. Both an output from the logarithmic decoder 2c and an output from the peak holding circuit 4 are applied to the display decoder 2d for conversion to an indicator signal suitable for driving a display 8. An output from the display decoder 2d is supplied to the driver 7 which in turn drives the display 8 in response to the indicator signal from the display decoder 2d. As as result, an instantaneous level and a peak level of the digital signal are indicated on the indicator means 8.

The display decoder 2d similarly to the logarithmic decoder 2c, comprises a ROM, logic gates, etc. It has not only a decoding pattern to keep the resolution unchanged (at 1 dB), but also another decode pattern to increase the resolution (e.g., to 3 dB). Any desired decoding pattern is selected by operating the selector 3. Depending on the choice of resolution, the display decoder 2d changes its output when the input applied thereto is subjected to a variation larger than 1 dB or 3 dB. Consequently, the digital level is indicated on the display 8 with steps of 1 dB or 3 dB in correspondence to the selected operation.

The peak holding circuit 4 is connected upstream of the decoder 2d and holds a peak value of the output for the decoder 2c irrespective of the selection made on the selector means 3. Accordingly, even with the possible choices of the selector mean 3 switched from one to another during the display mode, it will not happen that the value held immediately prior to the switching operation remains and continues to be displayed.

It is to be noted that a reset switch 6 associated with the peak holder circuit 4 can be dispensed with.

Figure 6:
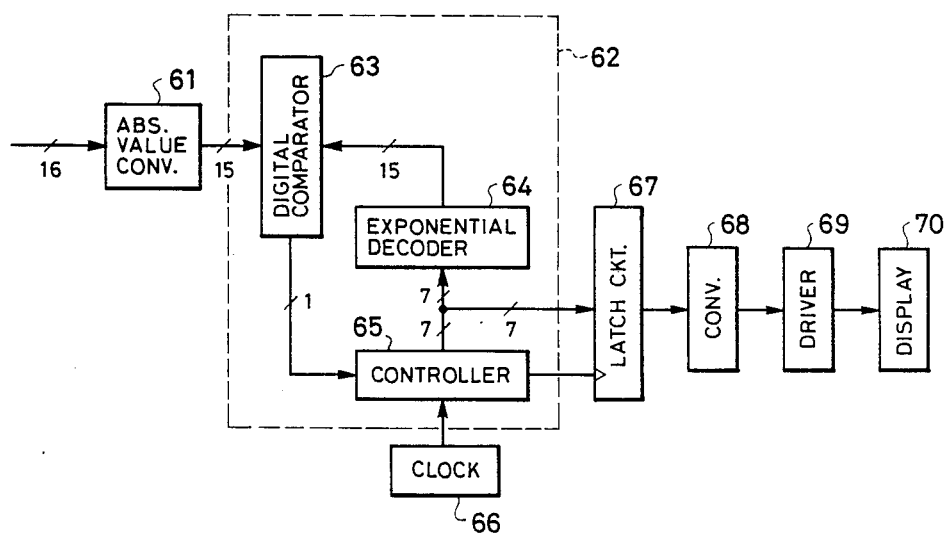
FIG. 6 is a block diagram of a digital level indicating device according to a fourth embodiment of the present invention.

FIG. 6 is a block diagram of a digital level indicating device according to a fourth embodiment of the present invention. In this figure, a converter circuit 61 converts a digital signal applied thereto to an absolute value signal representative of an absolute value of the digital input signal and then outputs the resultant absolute value signal. This digital absolute value signal is applied to a sequential comparison circuit 62. The sequential comparison circuit 62 consists of a digital comparator 63, an exponential decoder 64 comprising a ROM, etc., and a control circuit 65. The exponential decoder 64 performs anti-logarithmic conversion. The sequential comparison circuit 62 is operated in accordance with clock signals generated by a clock generator circuit 66. A latch circuit 67 is adapted to latch an output from the control circuit 65. A converter circuit 68 is adapted to convert a log-converted signal to an indicator signal suitable for visual display. A driver circuit 69 is adapted to drive a display 70. The converter circuit 68, the driver circuit 69, and the display 70 correspond to the OR circuits 21, 22 . . . , the inverters 31, 32 . . . , and the light emitting diodes 41, 42 . . . and the resistors 51 and 52 . . . , respectively, of FIG. 2.

With the above arrangement, the digital signal applied to the converter circuit 61 is converted to the absolute value signal. This absolute value signal is applied to the sequential comparison circuit 62 to be log-converted for decibel indication. Specifically, the control circuit 65 sequentially sets the most significant unset bit of 7 bits of its output equal to 1 for a sequential comparison. The exponential decoder 64 outputs data of 15 bits corresponding to those data, which has the MSB of 1, among the input data of 7 bits.

Assuming that each piece of input data comprises 16 bits, the dynamic range spans over approximately 90 dB. Resolution of the exponential decoder 64 is set in accordance with the minimum resolution to be indicated. In attempting to indicate a digital level with steps of 1 dB at minimum, for example, an input signal to the decoder 64 can be composed of 7 bits because that signal needs to represent about 90 different values. The exponential decoder 64 outputs the data of 15 bits corresponding to the log-converted signal of 7 bits.

The comparator 63 compares a reference signal applied thereto from the exponential decoder 64 with the signal applied from the converter 61. It causes the control circuit 65 to continue to output a value of 1 for the currently processed bit when the converter signal is larger than the exponential decoder signal, but to change that bit to a 0 in the reverse condition.

Such operation is sequentially repeated for each of the 7 bits from the MSB to the LSB. As a result, the exponential decoder output is always made to be the maximum value smaller than the converter signal. The resultant 7 bit signal is very close to the logarithm of the converter signal. When the comparison has been complete for all 7 bits, the data of 7 bits issued from the control circuit 65 is latched into the latch circuit 67. The data latched in the latch circuit 67 is in the form of a log-converted signal which has resulted from logarithmic conversion of the absolute value signal delivered from the converter circuit 61. Furthermore, an output from the latch circuit 67 is applied to another converter circuit 68 in which it is converted to a display signal suitable for visual indication. In addition, the display 70 is driven by the driver circuit 69 in accordance with the indicator signal, so that a level of the digital signal is displayed with steps of 1 dB.

When changing the extent of display steps (i.e., resolution), it is enough to vary the corresponding relation between the input and the output of the exponential decoder 64. In other words, it is just required to provide a plurality of decoding patterns in the decoder 64 and to select any desired one of them on demand. This applies to not only the case of bar or dot indication, but also the case of indicating the digital level in figures.

This embodiment is advantageous in that the form of indication can be changed without the need of substantial modification to the hardware.

What is claimed is:

1. A digital level indicating device, comprising:
    a converter circuit for converting a digital signal applied thereto to an absolute value signal representative of an absolute value of said digital signal;
    a first decoder for log-converting said absolute value signal;
    a peak holder circuit for detecting and holding a peak of an output from said first decoder;
    a second decoder for converting an output signal of said first decoder and a signal held by said peak holder circuit to an indicator signal;
    indicator means for indicating a level of said digital signal in accordance with an output from said second decoder; and
    selector means for switching choices of resolution of said second decoder.

* * * * *